(12) United States Patent
Hara et al.

(10) Patent No.: US 11,961,715 B2
(45) Date of Patent: Apr. 16, 2024

(54) SUBSTRATE PROCESSING APPARATUS, SUBSTRATE RETAINER AND METHOD OF MANUFACTURING SEMICONDUCTOR DEVICE

(71) Applicant: KOKUSAI ELECTRIC CORPORATION, Tokyo (JP)

(72) Inventors: Daisuke Hara, Toyama (JP); Takashi Yahata, Toyama (JP); Tsuyoshi Takeda, Toyama (JP); Kenji Ono, Toyama (JP); Kazuhiko Yamazaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 643 days.

(21) Appl. No.: 17/188,034

(22) Filed: Mar. 1, 2021

(65) Prior Publication Data

US 2021/0183670 A1    Jun. 17, 2021

Related U.S. Application Data

(63) Continuation of application No. PCT/JP2018/033861, filed on Sep. 12, 2018.

(51) Int. Cl.
| | | |
|---|---|---|
| H01J 37/32 | (2006.01) | |
| H01L 21/02 | (2006.01) | |
| H01L 21/67 | (2006.01) | |
| H01L 21/687 | (2006.01) | |

(52) U.S. Cl.
CPC .... *H01J 37/3244* (2013.01); *H01J 37/32715* (2013.01); *H01J 37/32834* (2013.01); *H01J 37/32862* (2013.01); *H01L 21/0217* (2013.01); *H01L 21/02271* (2013.01); *H01L 21/67109* (2013.01); *H01L 21/68771* (2013.01); *H01J 2237/20214* (2013.01); *H01J 2237/332* (2013.01)

(58) Field of Classification Search
None
See application file for complete search history.

(56) References Cited

U.S. PATENT DOCUMENTS

| | | | |
|---|---|---|---|
| 2013/0252434 A1 | 9/2013 | Yuasa et al. | |
| 2018/0135179 A1* | 5/2018 | Ikeuchi | C23C 16/46 |

FOREIGN PATENT DOCUMENTS

| | | |
|---|---|---|
| JP | 04-245421 A | 9/1992 |
| JP | 07-176490 A | 7/1995 |
| JP | 2000-173945 A | 6/2000 |
| JP | 2007-503126 A | 2/2007 |
| JP | 2013-225653 A | 10/2013 |

* cited by examiner

*Primary Examiner* — Feifei Yeung Lopez
(74) *Attorney, Agent, or Firm* — Volpe Koenig (57) ABSTRACT

Described herein is a technique capable of efficiently removing a foreign substance in a reaction tube. According to one aspect of the technique, there is provided a substrate processing apparatus including: a reaction tube in which a substrate is processed; and a substrate retainer including a plurality of support columns configured to support the substrate, wherein at least one among the plurality of the support columns includes: a hollow portion through which an inert gas is supplied; and a gas supply port through which the inert gas is supplied toward an inner wall of the reaction tube.

12 Claims, 7 Drawing Sheets

SUBSTRATE PROCESSING APPARATUS, SUBSTRATE RETAINER AND METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of International Application No. PCT/JP2018/033861, filed on Sep. 12, 2018, in the WIPO, the entire contents of which are hereby incorporated by reference.

FIELD

The present disclosure relates to a substrate processing apparatus, a substrate retainer and a method of manufacturing a semiconductor device.

DESCRIPTION OF THE RELATED ART

As a part of manufacturing processes of a semiconductor device, a substrate processing (for example, a film-forming process) may be performed by supplying a process gas to a substrate accommodated in a process vessel of a substrate processing apparatus. When the substrate processing described above is performed, a part of the process gas may be adsorbed (adhered) to an inner wall or other location of the process vessel.

For example, according to some related arts, a technique of suppressing the generation of a foreign substance in the process vessel is disclosed.

The foreign substance in the process vessel may adhere to an inner wall of a reaction tube, may be remained on the inner wall of the reaction tube, or may be accumulated below the reaction tube. It is preferable to efficiently remove the foreign substance.

SUMMARY

Described herein is a technique capable of efficiently removing a foreign substance in a reaction tube.

Other problems and novel features of the technique described herein will become apparent from the descriptions of the present specification and the accompanying drawings.

The following is a brief overview of a representative one of the present disclosure.

That is, according to one aspect of the technique of the present disclosure, there is provided a substrate processing apparatus including: a reaction tube in which a substrate is processed; and a substrate retainer including a plurality of support columns configured to support the substrate, wherein at least one among the plurality of the support columns includes: a hollow portion through which an inert gas is supplied; and a gas supply port through which the inert gas is supplied toward an inner wall of the reaction tube.

DETAILED DESCRIPTION

Hereinafter, one or more embodiments (also simply referred to as "embodiments") according to the technique of the present disclosure will be described with reference to the drawings. Like reference numerals represent like components in the drawings, and redundant descriptions related thereto will be omitted. In the drawings, for the sake of convenience of the descriptions, features may be schematically illustrated as compared with actual features. However, the drawings are merely examples of the embodiments, and the embodiments according to the technique of the present disclosure are not limited thereto.

Embodiment

Hereinafter, an embodiment according to the technique of the present disclosure will be described with reference to FIGS. 1 through 8.

(1) Configuration of Substrate Processing Apparatus (Heating Apparatus)

Figure 1:
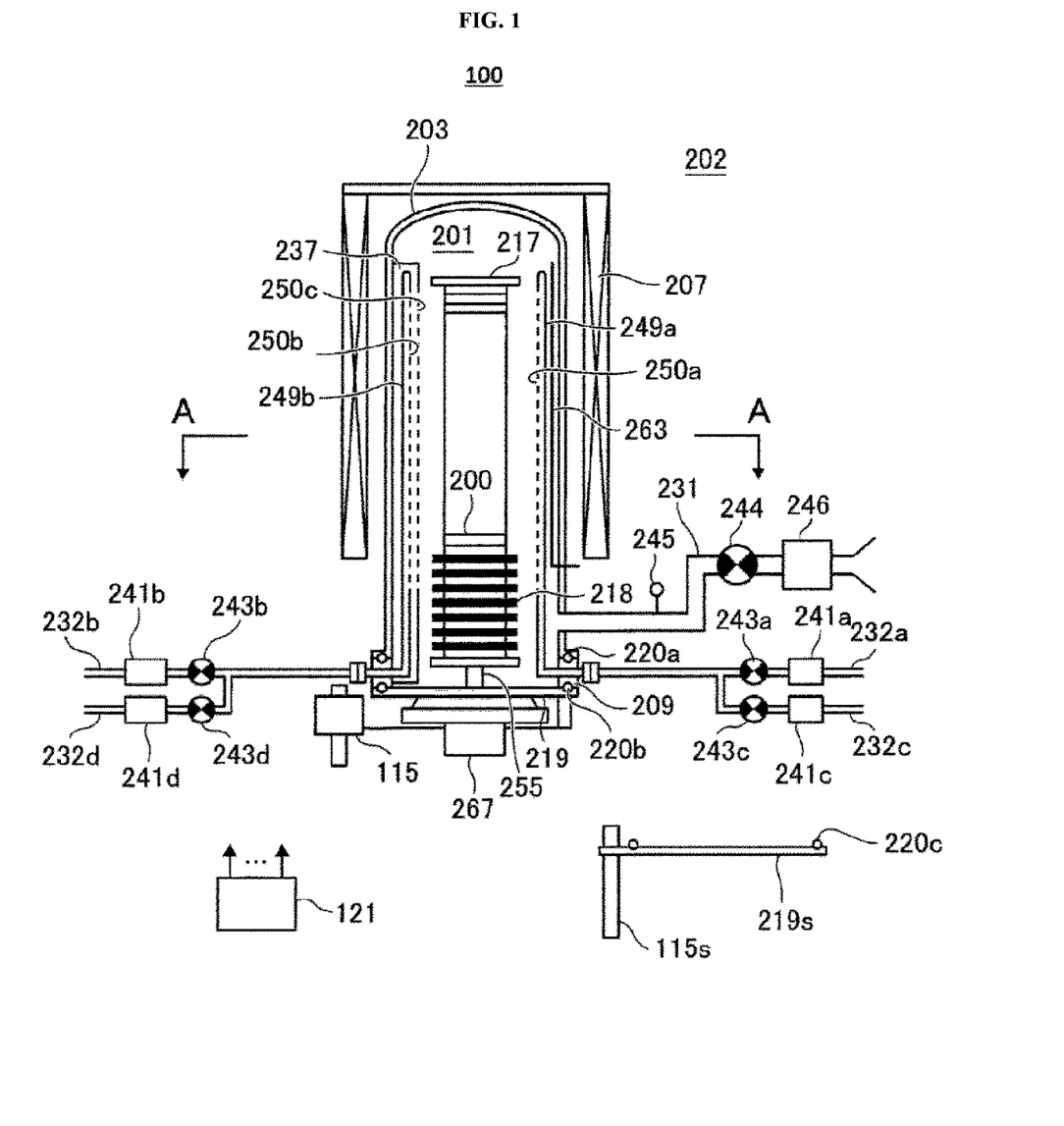
FIG. 1 schematically illustrates a vertical cross-section of a vertical type process furnace of a substrate processing apparatus preferably used in one or more embodiment described herein.

As shown in FIG. 1, for example, a substrate processing apparatus 100 according to the present embodiment includes a vertical type process furnace (also simply referred to as a "process furnace") 202 capable of accommodating a plurality of substrates in a multistage manner in a vertical direction. The process furnace 202 includes a heater 207 serving as a heating apparatus (heating structure). The heater 207 is of a cylinder shape, and is vertically installed while being supported by a heater base (not shown) serving as a support plate. As described later, the heater 207 also functions as an activator (which is an activation structure) or an exciter (which is an excitation structure) capable of activating (or exciting) a gas such as a source gas and a reactive gas by heat.

<Process Chamber>

A reaction tube 203 is provided at an inner side of the heater 207 to be aligned in a manner concentric with the heater 207. For example, the reaction tube 203 is made of a heat resistant material such as quartz ($SiO_2$), silicon carbide (SiC) and silicon nitride (SiN). The reaction tube 203 is of a cylinder shape with a closed upper end and an open lower end. A manifold (which is an inlet flange) 209 is provided under the reaction tube 203 to be aligned in a manner concentric with the reaction tube 203. The manifold 209 is made of a metal such as stainless steel (SUS). The manifold 209 is of a cylinder shape with open upper and lower ends. The upper end of the manifold 209 is engaged with the lower end of the reaction tube 203 so as to support the reaction tube 203. An O-ring 220a serving as a seal is provided between the manifold 209 and the reaction tube 203. As the manifold 209 is supported by the heater base (not shown), the reaction tube 203 is installed vertically. A process vessel (also referred to as a "reaction vessel") is constituted mainly by the reaction tube 203 and the manifold 209. A process chamber 201 is provided in a hollow cylindrical portion of the process vessel. The process chamber 201 is configured to accommodate a plurality of wafers including a wafer 200 serving as a substrate. The process vessel is not limited to the configuration described above. For example, the reaction tube 203 alone may be referred to as the process vessel.

<Gas Supplier>

Nozzles 249a and 249b are provided in the process chamber 201 so as to penetrate a side wall of the manifold 209. Gas supply pipes 232a and 232b are connected to the nozzles 249a and 249b, respectively. As described above, the two nozzles 249a and 249b and the two gas supply pipes 232a and 232b are provided in the reaction tube 203, and various gases may be supplied into the process chamber 201 via the two nozzles 249a and 249b and the two gas supply pipes 232a and 232b.

Mass flow controllers 241a and 241b serving as flow rate controllers (flow rate control structures) and valves 243a and 243b serving as opening/closing valves are sequentially installed at the gas supply pipes 232a and 232b, respectively, from upstream sides to downstream sides of the gas supply pipes 232a and 232b. Hereinafter, a mass flow controller is also referred to as an "MFC". Gas supply pipes 232c and 232d configured to supply an inert gas are connected to the gas supply pipes 232a and 232b at downstream sides of the valves 243a and 243b of the gas supply pipes 232a and 232b, respectively. MFCs 241c and 241d and valves 243c and 243d are sequentially installed at the gas supply pipes 232c and 232d, respectively, from upstream sides to downstream sides of the gas supply pipes 232c and 232d.

Figure 2:
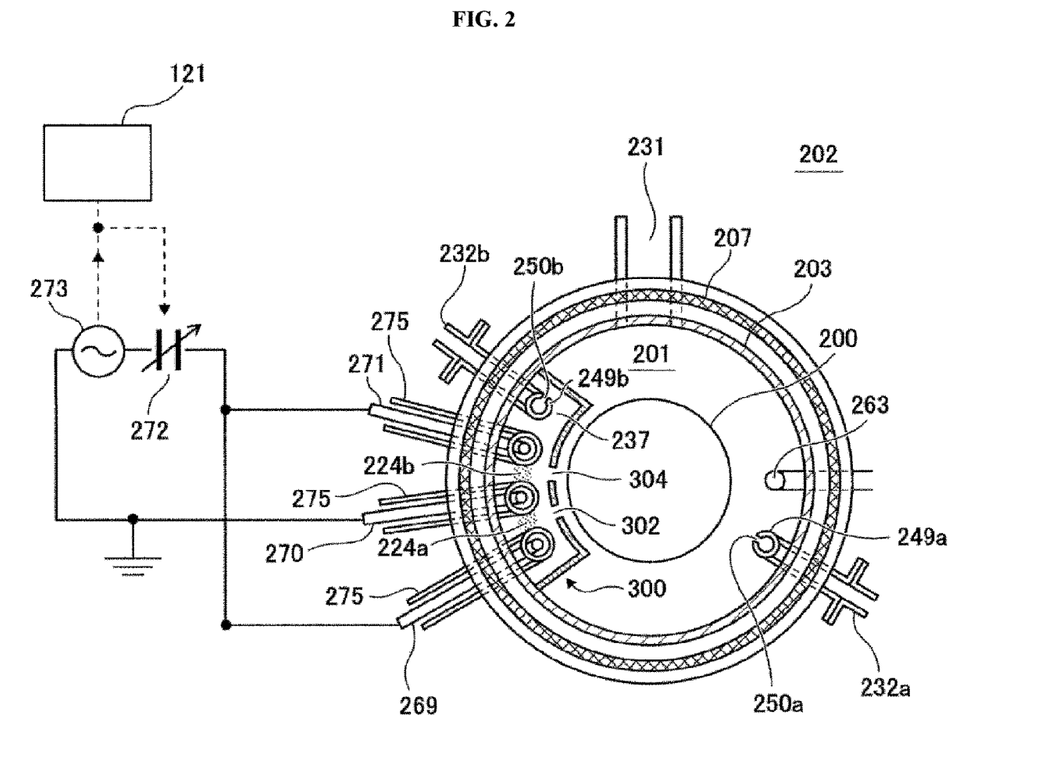
FIG. 2 schematically illustrates a horizontal cross-section taken along the line A-A of the vertical type process furnace of the substrate processing apparatus preferably used in the embodiments shown in FIG. 1.

As shown in FIG. 2, the nozzle 249a is installed in a space between an inner wall of the reaction tube 203 and the plurality of the wafers including the wafer 200 accommodated in the process chamber 201, and extends from a lower portion of the inner wall of the reaction tube 203 to an upper portion of the inner wall of the reaction tube 203 along a stacking direction of the plurality of the wafers. That is, the nozzle 249a is provided adjacent to edges (peripheral portions) of the plurality of the wafers accommodated in the process chamber 201. In other words, the nozzle 249a is provided perpendicularly to surfaces (flat surfaces) of the plurality of the wafers. A plurality of gas supply holes 250a configured to supply the gas are provided at a side surface of the nozzle 249a. The gas supply holes 250a are open toward a center of the reaction tube 203, and are configured to supply the gas toward the plurality of the wafers accommodated in the process chamber 201. The gas supply holes 250a are provided from a lower portion of the reaction tube 203 to an upper portion of the reaction tube 203. The opening areas of the gas supply holes 250a are equal to one another, and the gas supply holes 250a are provided at the same pitch.

Figure 3A:
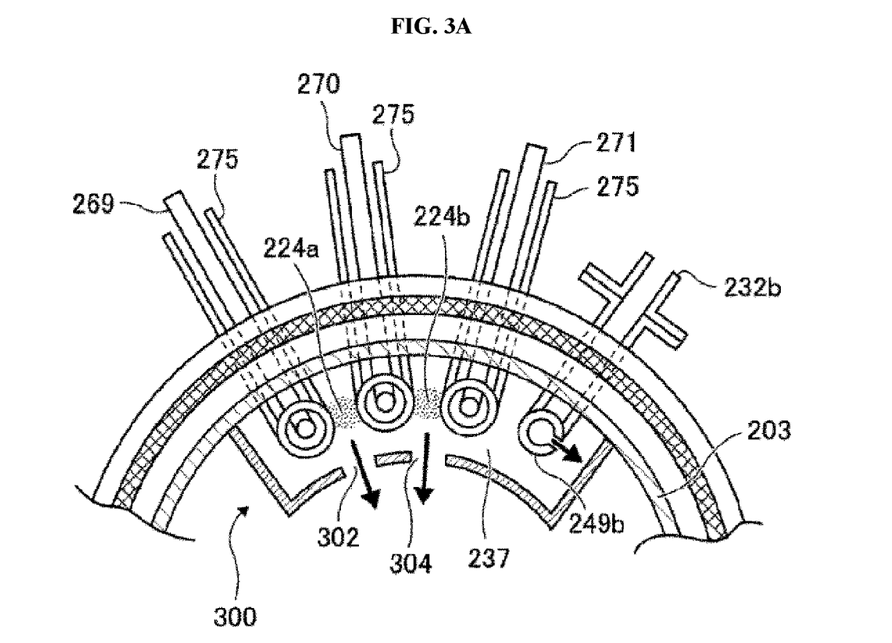
FIG. 3A is an enlarged cross-sectional view for explaining a buffer structure of the substrate processing apparatus preferably used in the embodiments described herein.
Figure 3B:
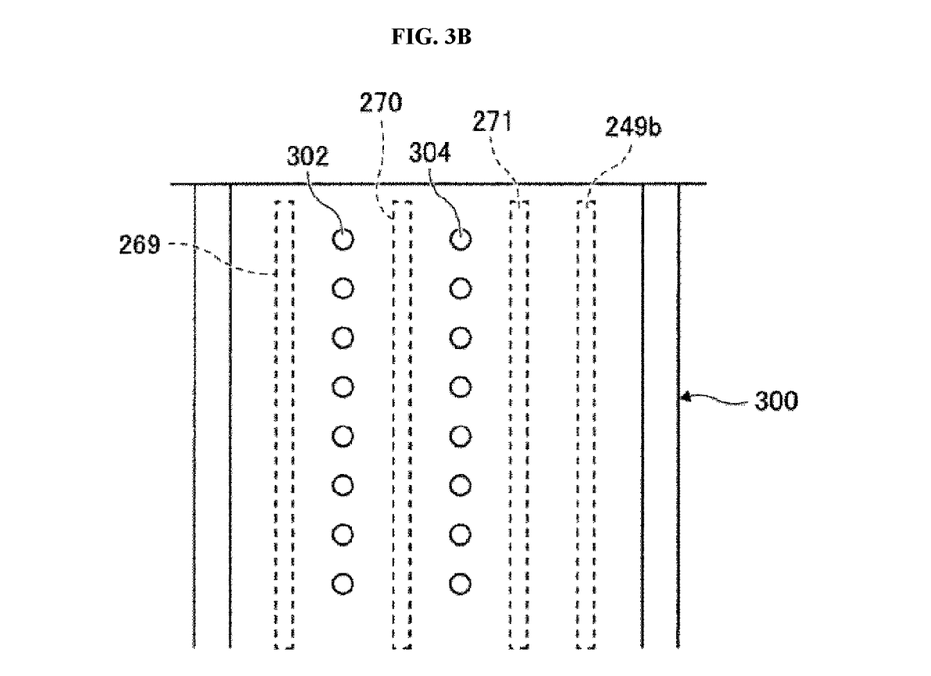
FIG. 3B is a schematic diagram for explaining the buffer structure of the substrate processing apparatus preferably used in the embodiments described herein.

The nozzle 249b is connected to a front end of the gas supply pipe 232b. The nozzle 249b is provided in a buffer chamber 237 serving as a gas dispersion space. As shown in FIG. 2, the buffer chamber 237 is installed in an annular space between the inner wall of the reaction tube 203 and the plurality of the wafers including the wafer 200 accommodated in the process chamber 201 when viewed from above, and extends from the lower portion of the inner wall of the reaction tube 203 to the upper portion of the inner wall of the reaction tube 203 along the stacking direction of the plurality of the wafers. That is, the buffer chamber 237 is defined by a buffer structure 300 provided in a region that horizontally surrounds a wafer arrangement region where the plurality of the wafers are arranged along the stacking direction of the plurality of the wafers. The buffer structure 300 is made of an insulating material such as quartz. A plurality of gas supply ports 302 and a plurality of gas supply ports 304, through which the gas is supplied, are provided on an arc-shaped wall surface of the buffer structure 300. As shown in FIGS. 2 and 3, the gas supply ports 302 and the gas supply ports 304 are provided to face a plasma generation region 224a between rod-shaped electrodes 269 and 270 described later and a plasma generation region 224b between rod-shaped electrodes 270 and 271 described later, respectively. The gas supply ports 302 and the gas supply ports 304 are open toward the center of the reaction tube 203 to supply the gas toward the plurality of the wafers accommodated in the process chamber 201. The gas supply ports 302 and the gas supply ports 304 are provided from the lower portion of the reaction tube 203 to the upper portion of the reaction tube 203. The opening areas of the gas supply ports 302 are equal to one another, and the gas supply ports 302 are provided at the same pitch. The opening areas of the gas supply ports 304 are equal to one another, and the gas supply ports 304 are provided at the same pitch.

The nozzle 249b is provided in the buffer structure 300 adjacent to the region that horizontally surrounds the wafer arrangement region where the plurality of the wafers are arranged along the stacking direction of the plurality of the wafers. That is, the nozzle 249b is provided adjacent to the edges (the peripheral portions) of the plurality of the wafers accommodated in the process chamber 201. In other words, the nozzle 249b is provided perpendicularly to the surfaces (the flat surfaces) of the plurality of the wafers. A plurality of gas supply holes 250b configured to supply the gas are provided at a side surface of the nozzle 249b. The gas supply holes 250b are open toward a wall surface of the buffer structure 300 provided along a radial direction with respect to the arc-shaped wall surface of the buffer structure 300, and are configured to supply the gas toward the wall surface of the buffer structure 300. As a result, the reactive gas is dispersed (diffused) in the buffer chamber 237, and is not directly sprayed onto the rod-shaped electrodes 269 through 271. Therefore, it is possible to suppress the generation of particles. The gas supply holes 250b are provided from the lower portion to the upper portion of the reaction tube 203.

According to the present embodiment, the gas such as the source gas and the reactive gas are supplied through the nozzles 249a and 249b and the buffer chamber 237, which are provided in the vertical annular space (that is, a cylindrical space) when viewed from above defined by an inner surface of a side wall (that is, the inner wall) of the reaction tube 203 and the edges of the plurality of the wafers including the wafer 200 arranged in the reaction tube 203. Then, the gas is ejected into the reaction tube 203 in the vicinity of the plurality of the wafers through the gas supply holes 250a and the gas supply holes 250b of the nozzles 249a and 249b, respectively, and the gas supply ports 302 and the gas supply ports 304 of the buffer chamber 237. The gas ejected into the reaction tube 203 mainly flows parallel to the surfaces of the plurality of the wafers, that is, in a horizontal direction. Thereby, it is possible to uniformly supply the gas to each of the plurality of the wafers and to improve a thickness uniformity of a film formed on each of the plurality of the wafers. After passing the surfaces of the plurality of the wafers, the gas (for example, a residual gas remaining after the reaction) flows toward an exhaust port, that is, toward an exhaust pipe 231 described later. However, a flow direction of the gas may vary depending on the location of the exhaust port, and is not limited to the vertical direction.

The source gas containing a predetermined element is supplied into the process chamber 201 through the gas supply pipe 232a provided with the MFC 241a and the valve 243a and the nozzle 249a. For example, a silane source gas containing silicon (Si) as the predetermined element may be used as the source gas.

In the present specification, the term "source gas" may refer to a source material in a gaseous state under the normal temperature and the normal pressure (atmospheric pressure) or a gas obtained by vaporizing a source material in a liquid state (that is, a liquid source) under the normal temperature and the normal pressure. In the present specification, the term "source material" may indicate only "source material in a liquid state", may indicate only "source material (source gas) in a gaseous state" and may indicate both of "source material in the liquid state" and "source material in the gaseous state".

A source gas containing silicon (Si) and a halogen element, that is, a halosilane source gas may be used as the silane source gas. A halosilane source material refers to a silane source material containing a halogen group. The halogen group includes at least one halogen element selected from the group consisting of chlorine (Cl), fluorine (F), bromine (Br) and iodine (I). That is, the halosilane source material may include at least one halogen group selected from the group consisting of a chloro group, a fluoro group, a bromo group and an iodo group. The halosilane source material may be considered as a halide.

For example, a source gas containing silicon (Si) and chlorine (Cl), that is, a chlorosilane source gas may be used as the halosilane source gas. For example, dichlorosilane ($SiH_2Cl_2$, abbreviated to DCS) gas may be used as the chlorosilane source gas.

The reactive gas serving as a reactant containing an element different from the predetermined element is supplied into the process chamber 201 through the gas supply pipe 232b provided with the MFC 241b and the valve 243b and the nozzle 249b. For example, a nitrogen (N)-containing gas may be used as the reactive gas. As the nitrogen-containing gas, for example, a hydrogen nitride-based gas may be used. The hydrogen nitride-based gas may also be referred to as a substance constituted by two elements of nitrogen (N) and hydrogen (H) without any other elements. The hydrogen nitride-based gas serves as a nitriding gas, that is, a nitrogen source material. For example, ammonia ($NH_3$) gas may be used as the hydrogen nitride-based gas.

The inert gas such as nitrogen ($N_2$) gas is supplied into the process chamber 201 through the gas supply pipes 232c and 232d provided with the MFCs 241c and 241d and the valves 243c and 243d, respectively, the gas supply pipes 232a and 232b and the nozzles 249a and 249b.

For example, a source gas supply system serving as a first gas supply system is constituted mainly by the gas supply pipe 232a, the MFC 241a, the valve 243a, and a reactive gas supply system (which is a reactant supply system) serving as a second gas supply system is constituted mainly by the gas supply pipe 232b, the MFC 241b and the valve 243b. An inert gas supply system is constituted mainly by the gas supply pipes 232c and 232d, the MFCs 241c and 241d and the valves 243c and 243d. The source gas supply system, the reactive gas supply system and the inert gas supply system may be collectively referred to as a process gas supply system (or a process gas supplier or a gas supplier). Further, the source gas and the reactive gas may be collectively referred to as the process gas.

<Plasma Generator>

As illustrated in FIGS. 2 and 3, in the buffer chamber 237, three rod-shaped electrodes 269, 270 and 271 made of a conductor and formed as an elongated thin and long structure are provided from the lower portion to the upper portion of the reaction tube 203 along the stacking direction of the plurality of the wafers including the wafer 200. Each of the rod-shaped electrodes 269, 270 and 271 is provided parallel to the nozzle 249b. Each of the rod-shaped electrodes 269, 270 and 271 is covered and protected by an electrode protecting pipe 275 from an upper portion to a lower portion thereof. The rod-shaped electrode 270 is connected to and grounded to the electrical ground serving as a reference potential, and the two rod-shaped electrodes 269 and 271 of the three rod-shaped electrodes 269, 270 and 271 disposed at both sides of the rod-shaped electrode 270 are connected to a high frequency power supply 273 through a matcher 272 (which is a matching structure). That is, the rod-shaped electrodes 269 and 271 connected to the high frequency power supply 273 and the rod-shaped electrode 270 connected to the electrical ground are alternately arranged, and the rod-shaped electrode 270 provided between the rod-shaped electrodes 269 and 271 serves as a common ground for the rod-shaped electrodes 269 and 271. In other words, the rod-shaped electrode 270 connected to the electrical ground is disposed between the rod-shaped electrodes 269 and 271, and the rod-shaped electrodes 269 and 270 and the rod-shaped electrodes 271 and 270 respectively form pairs to generate plasma. That is, the rod-shaped electrode 270 connected to the electrical ground is commonly used for the two rod-shaped electrodes 269 and 271 adjacent to the rod-shaped electrode 270 and connected to the high frequency power supply 273. By applying high frequency power (that is, RF power) to the rod-shaped electrodes 269 and 271 from the high frequency power supply 273, the plasma is generated in the plasma generation region 224a between the rod-shaped electrodes 269 and 270 and in the plasma generation region 224b between the rod-shaped electrodes 270 and 271. A plasma generator (which is a plasma generating apparatus) capable of generating the plasma in the plasma generation regions 224a and 224b is constituted mainly by the rod-shaped electrodes 269, 270 and 271, the electrode protecting pipe 275. The plasma generator serves as a plasma source. The plasma generator may further include the matcher 272 and the high frequency power supply 273. As described later, the plasma generator (plasma source) also functions as an activator (which is an activation structure) or an exciter (which is an excitation structure) capable of activating (or exciting) the gas to the plasma (that is, into a plasma state).

The electrode protecting pipe 275 is configured to insert each of the rod-shaped electrodes 269, 270 and 271 into the buffer chamber 237 in a state of being isolated from an inner atmosphere of the buffer chamber 237. If an oxygen ($O_2$) concentration of an inside of the electrode protecting pipe 275 is set to the same level as an oxygen concentration of an outside air (an air atmosphere), each of the rod-shaped electrodes 269, 270 and 271 inserted into the electrode protecting pipe 275 may be oxidized by the heat of the heater 207. Therefore, by charging the inside of the electrode protecting pipe 275 with the inert gas such as the $N_2$ gas or by purging the inside of the electrode protecting pipe 275 with the inert gas such as the $N_2$ gas using an inert gas purge apparatus, it is possible to lower the oxygen concentration of the inside of the electrode protecting pipe 275. Thereby, it is possible to suppress the oxidation of the rod-shaped electrodes 269, 270 and 271.

<Exhauster>

The exhaust pipe 231 configured to exhaust an inner atmosphere of the process chamber 201 is provided at the reaction tube 203. A vacuum pump 246 serving as a vacuum exhaust apparatus is connected to the exhaust pipe 231 through a pressure sensor 245 and an APC (Automatic Pressure Controller) valve 244. The pressure sensor 245 serves as a pressure detector (pressure detection device) to detect an inner pressure of the process chamber 201, and the APC valve 244 serves as an exhaust regulator (pressure regulator). With the vacuum pump 246 in operation, the APC valve 244 may be opened or closed to vacuum-exhaust the process chamber 201 or stop the vacuum exhaust. With the vacuum pump 246 in operation, an opening degree of the APC valve 244 may be adjusted based on pressure information detected by the pressure sensor 245, in order to control (adjust) the inner pressure of the process chamber 201. An exhaust system (also referred to as an "exhauster") is constituted mainly by the exhaust pipe 231, the APC valve 244 and the pressure sensor 245. The exhaust system may further include the vacuum pump 246. The present embodiment is not limited to an example in which the exhaust pipe 231 is provided at the reaction tube 203. For example, similar to the nozzles 249a and 249b, the exhaust pipe 231 may be provided at the manifold 209 instead of the reaction tube 203.

A seal cap 219 serving as a furnace opening lid capable of airtightly sealing a lower end opening of the manifold 209 is provided under the manifold 209. The seal cap 219 is in contact with the lower end of the manifold 209 from thereunder. The seal cap 219 is made of a metal such as SUS (stainless steel), and is of a disk shape. An O-ring 220b serving as a seal provided on an upper surface of the seal cap 219 so as to be in contact with the lower end of the manifold 209. A rotator 267 configured to rotate a boat 217 described later is provided under the seal cap 219 opposite to the process chamber 201. A rotating shaft 255 of the rotator 267 is connected to the boat 217 through the seal cap 219. As the rotator 267 rotates the boat 217, the plurality of the wafers including the wafer 200 supported by the boat 217 are rotated. That is, the rotator 267 is configured to rotate the plurality of the wafers including the wafer 200. A boat elevator 115 serving as an elevator is provided outside the reaction tube 203 vertically. The seal cap 219 may be elevated or lowered in the vertical direction by the boat elevator 115. When the seal cap 219 is elevated or lowered by the boat elevator 115, the boat 217 placed on the seal cap 219 may be transferred (loaded) into the process chamber 201 or transferred (unloaded) out of the process chamber 201. The boat elevator 115 serves as a transfer device (or a transport device) capable of loading the boat 217 (that is, the plurality of the wafers including the wafer 200 accommodated in the boat 217) into the process chamber 201 or unloading the boat 217 (that is, the plurality of the wafers including the wafer 200 accommodated in the boat 217) out of the process chamber 201. A shutter 219s serving as a furnace opening lid capable of airtightly sealing the lower end opening of the manifold 209 is provided under the manifold 209. The shutter 219s is configured to close the lower end opening of the manifold 209 when the seal cap 219 is lowered by the boat elevator 115. The shutter 219s is made of a metal such as SUS (stainless steel), and of a disk shape. An O-ring 220c serving as a seal is provided on an upper surface of the shutter 219s so as to be in contact with the lower end of the manifold 209. An opening/closing operation of the shutter 219s such as an elevation operation and a rotation operation is controlled by a shutter opener/closer (which is a shutter opening/closing structure) 115s.

<Substrate Retainer>

As shown in FIG. 1, the boat 217 (which is a substrate retainer) is configured to align the plurality of the wafers including the wafer 200, for example, from 25 to 200 wafers in the vertical direction and configured to support the plurality of the wafers in a multistage manner, while the plurality of the wafers are horizontally oriented with their centers aligned with each other. That is, the boat 217 supports (accommodates) the plurality of the wafers including the wafer 200 with a predetermined interval therebetween. The boat 217 is made of a heat resistant material such as quartz and SiC. A plurality of insulating plates 218 are provided under the boat 217 in a multistage manner.

As shown in FIG. 2, a temperature sensor 263 serving as a temperature detector is provided in the reaction tube 203. The state of electric conduction to the heater 207 is adjusted based on temperature information detected by the temperature sensor 263 such that a desired temperature distribution of the inner temperature of the process chamber 201 can be obtained. Similar to the nozzles 249a and 249b, the temperature sensor 263 is provided along the inner wall of the reaction tube 203.

Figure 7:
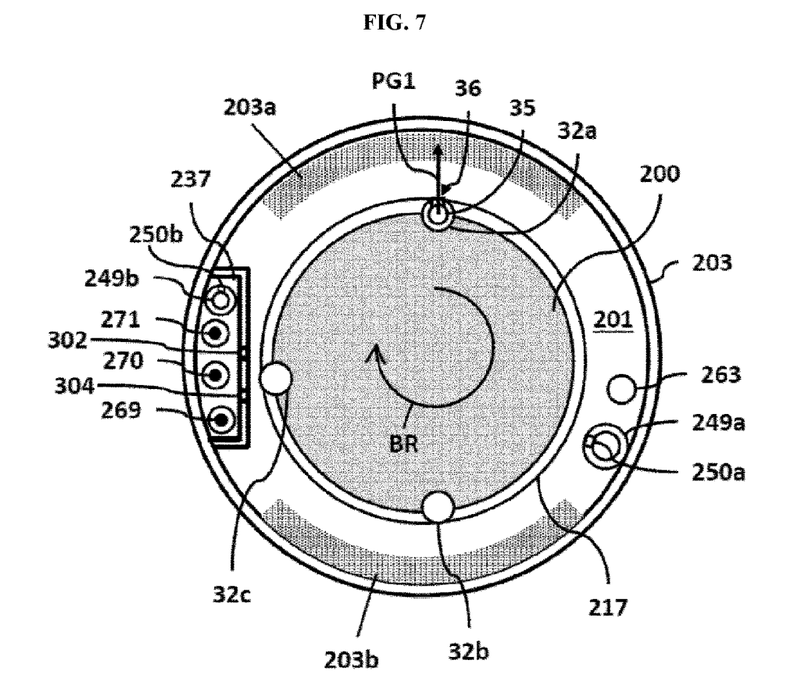
FIG. 7 schematically illustrates a horizontal cross-section of the vertical type process furnace shown in FIG. 2 with a boat loaded according to the embodiment described herein.
Figure 8:
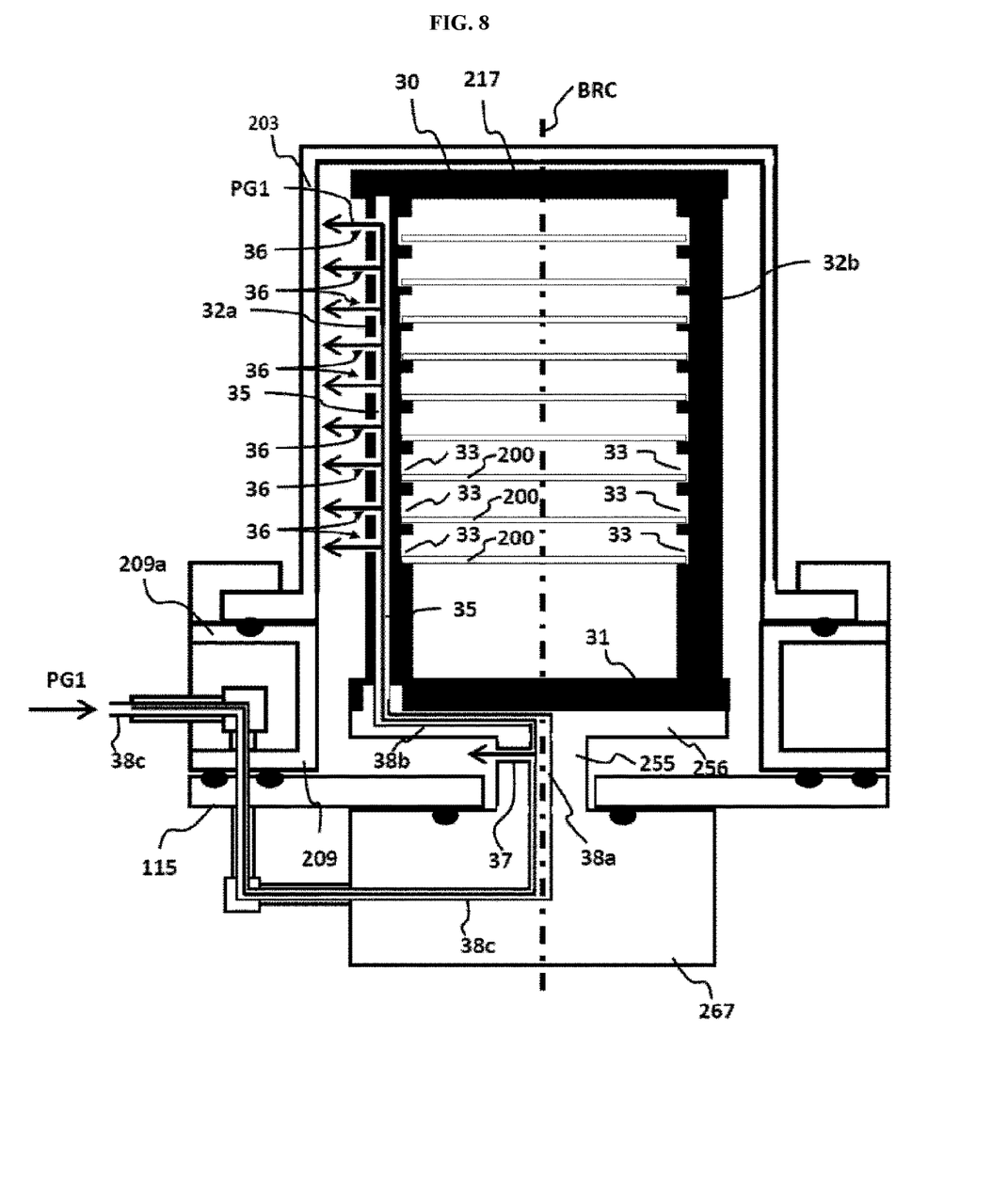
FIG. 8 schematically illustrates a vertical cross-section of the vertical type process furnace with the boat loaded according to the embodiment described herein.

FIG. 7 schematically illustrates a horizontal cross-section of the vertical type process furnace 202 shown in FIG. 2 with the boat 217 loaded according to the present embodiment. FIG. 8 schematically illustrates a vertical cross-section of the vertical type process furnace 202 with the boat 217 loaded according to the present embodiment.

As shown in FIGS. 7 and 8, the boat 217 includes a pair of end plates (an upper end plate 30 and a lower end plate 31) and a plurality of support columns (which are boat columns, for example, three support columns 32a, 32b and 32c) provided between the upper end plate 30 and the lower end plate 31 to connect the upper end plate 30 and the lower end plate 31. The boat 217 may further include the rotator 267. As such, the boat 217 and the rotator 267 may be collectively referred to as the substrate retainer. A plurality of support recesses 33 are engraved at each of the three support columns 32a, 32b and 32c at equal intervals in a lengthwise direction of each of the three support columns 32a, 32b and 32c. The support recesses 33 engraved at the same stage of each of the three support columns 32a, 32b and 32c are open to face one another. By inserting the plurality of the wafers including the wafer 200 to the support recesses 33 engraved at the same stage of each of the three support columns 32a, 32b and 32c, the boat 217 supports the plurality of the wafers vertically arranged in a multistage manner while the plurality of the wafers are horizontally oriented with their centers aligned with one another. The three support columns 32a, 32b and 32c are made of an insulating material such as quartz.

A hollow portion (which serves as a gas supply tube) 35 through which the inert gas is supplied and a plurality of gas supply ports 36 through which the inert gas (purge gas) is supplied (ejected) toward the inner wall of the reaction tube 203 are provided at at least one among the three support columns 32a, 32b, 32c provided with the support recesses 33. The plurality of the gas supply ports 36 may also be referred to as the gas supply ports 36. For example, the hollow portion 35 and the gas supply ports 36 are provided at the support column 32a. The gas supply ports 36 are open toward the inner wall of the reaction tube 203, and are configured to supply the inert gas ("PG1" shown in FIGS. 7 and 8) toward the inner wall of the reaction tube 203. The gas supply ports 36 are provided from the lower portion of the reaction tube 203 to the upper portion of the reaction tube 203. The opening areas of the gas supply ports 36 are equal to one another, and the gas supply ports 36 are provided at the same pitch. Thereby, it possible to supply the inert gas to regions 203a and 203b on the inner wall of the reaction tube 203 where a foreign substance (by-products) is likely to adhere or remain. Further, it is also possible to effectively remove the foreign substance adhered to or remaining in the regions 203a and 203b on the inner wall of the reaction tube 203.

For example, the rotator 267 includes: the rotating shaft 255 configured to rotate the boat 217 in a boat rotating direction ("BR" shown in FIG. 7); a rotating table 256 configured to hold the boat 217 (for example, the three support columns 32a, 32b and 32c); and gas supply pipes (also referred to as "inert gas supply pipes" or "purge gas supply pipes") 38a and 38b configured to supply the inert gas to the boat 217 provided with the hollow portion 35. The gas supply pipe (also referred to as a "first gas supply pipe") 38a installed at the rotating shaft 255 is provided at a rotation center ("BRC" shown in FIG. 8) of the rotating shaft 255. The gas supply pipe (also referred to as a "second gas supply pipe") 38b installed at the rotating table 256 is provided so as to connect the gas supply pipe 38a provided at a center (that is, the rotation center) of the rotating shaft 255 and the hollow portion 35 of the boat 217.

A gas supply pipe (also referred to as an "inert gas supply pipe" or a "purge gas supply pipe") 38c configured to supply the inert gas is provided at an inlet adapter 209a configured to hold the reaction tube 203, the boat elevator 115 serving as a boat elevating structure and the rotator 267.

For example, the inert gas is supplied to the hollow portion 35 of the boat 217 through the gas supply pipe 38a of the rotating shaft 255 and the gas supply pipe 38b of the rotating table 256 via the inlet adapter 209a, the boat elevator 115 and the rotator 267, and is ejected from the gas supply ports (which are openings) 36 of the boat 217 to the inner wall of the reaction tube 203 at a predetermined flow rate.

By rotating the boat 217 in the boat rotating direction BR by the rotator 267, it is possible to supply the purge gas PG1 to the entire inner wall of the reaction tube 203 including the regions 203a and 203b where the foreign substance (by-products) is likely to adhere or remain.

With respect to the pitch (opening pitch) of the gas supply ports 36 provided in the support column 32a, in order to supply a constant flow rate of the inert gas to the inner wall of the reaction tube 203, the opening pitch may be widened when a distance between the inner wall of the reaction tube 203 and each of the three support columns 32a, 32b and 32c is short, and the opening pitch may be narrowed when the distance between the inner wall of the reaction tube 203 and each of the three support columns 32a, 32b and 32c is long.

A gas supply port 37 is proved at the rotating shaft 255. The gas supply port 37 is configured to supply the purge gas to the manifold (inlet flange) 209 and/or the inlet adapter 209a provided under the reaction tube 203. Thereby, it possible to remove the by-products deposited (or accumulated) below the reaction tube 203.

The gas supply ports 36 and the gas supply port 37 may be of circular or elliptical shape.

<Controller>

Figure 4:
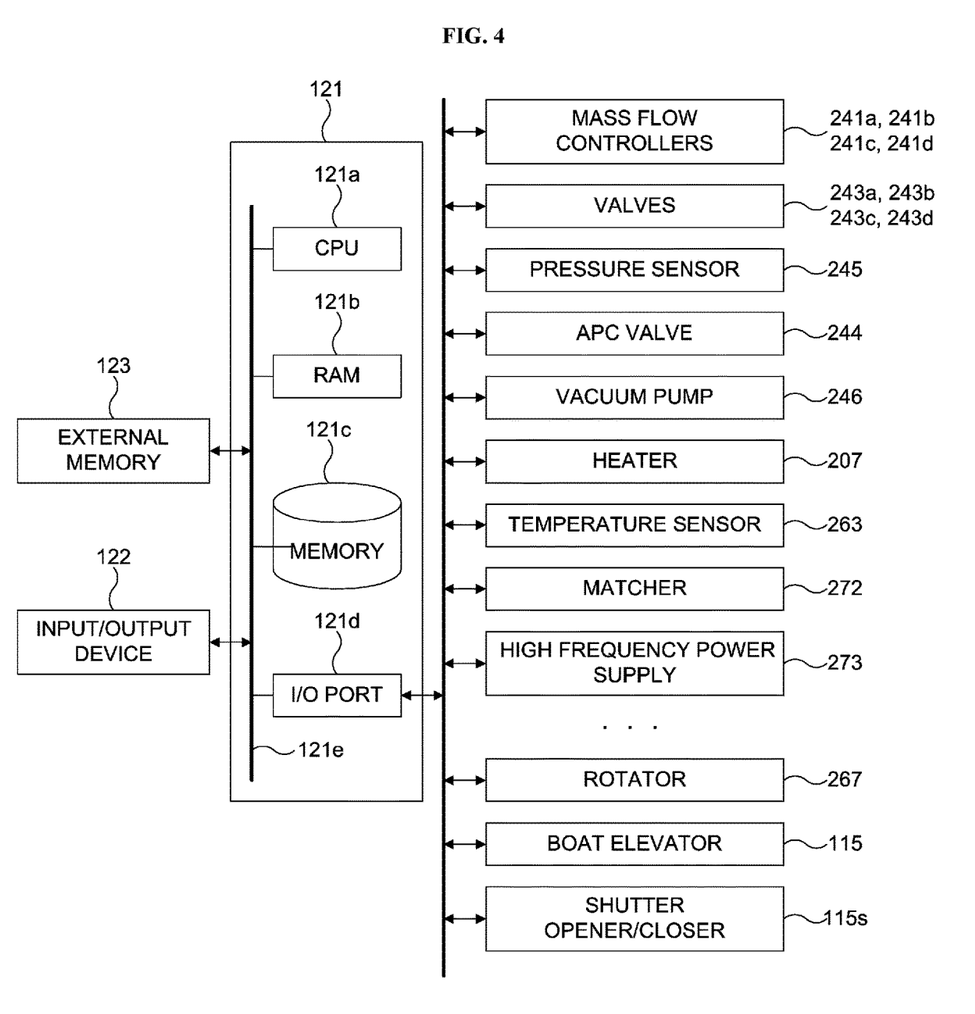
FIG. 4 is a block diagram schematically illustrating a configuration of a controller and related components of the substrate processing apparatus preferably used in the embodiments described herein.

Hereinafter, a controller 121 will be described with reference to FIG. 4. As shown in FIG. 4, the controller 121 serving as a control device (control structure) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus 121e. For example, an input/output device 122 such as a touch panel is connected to the controller 121.

The memory 121c is configured by components such as a flash memory and a hard disk drive (HDD). For example, a control program configured to control the operation of the substrate processing apparatus 100 or a process recipe containing information on the sequences and conditions of a substrate processing such as a film-forming process described later is readably stored in the memory 121c. The process recipe is obtained by combining steps of the substrate processing such as the film-forming process described later such that the controller 121 can execute the steps to acquire a predetermine result, and functions as a program. Hereafter, the process recipe and the control program may be collectively or individually referred to as a "program". In addition, the process recipe may also be simply referred to as a "recipe". In the present specification, the term "program" may indicate only the process recipe, may indicate only the control program, or may indicate both of the process recipe and the control program. The RAM 121b functions as a memory area (work area) where a program or data read by the CPU 121a is temporarily stored.

The I/O port 121d is connected to the above-described components such as the mass flow controllers (MFCs) 241a, 241b, 241c and 241d, the valves 243a, 243b, 243c and 243d, the pressure sensor 245, the APC valve 244, the vacuum pump 246, the heater 207, the temperature sensor 263, the matcher 272, the rotator 267, the boat elevator 115 and the shutter opener/closer 115s.

The CPU 121a is configured to read a control program from the memory 121c and execute the read control program. In addition, the CPU 121a is configured to read a recipe from the memory 121c in accordance with an operation command inputted from the input/output device 122. According to the contents of the read recipe, the CPU 121a may be configured to control various operations such as a control operation of the rotator 267, flow rate adjusting operations for various gases by the MFCs 241a, 241b, 241c and 241d, opening/closing operations of the valves 243a, 243b, 243c and 243d, an operation of adjusting the high frequency power supply 273 based on an impedance monitoring, an opening/closing operation of the APC valve 244, a pressure adjusting operation by the APC valve 244 based on the pressure sensor 245, a start and stop of the vacuum pump 246, a temperature adjusting operation of the heater 207 based on the temperature sensor 263, an operation of adjusting a forward/backward rotation, a rotation angle and a rotation speed of the boat 217 by the rotator 267 and an elevating and lowering operation of the boat 217 by the boat elevator 115.

The controller 121 may be embodied by installing the above-described program stored in an external memory 123 into a computer. For example, the external memory 123 may include a magnetic disk such as a hard disk, an optical disk such as a CD, a magneto-optical disk such as an MO and a semiconductor memory such as a USB memory. The memory 121c or the external memory 123 may be embodied by a non-transitory computer readable recording medium. Hereafter, the memory 121c and the external memory 123 are collectively or individually referred to as recording media. In the present specification, the term "recording media" may indicate only the memory 121c, may indicate only the external memory 123, and may indicate both of the memory 121c and the external memory 123. Instead of the external memory 123, a communication means such as the Internet and a dedicated line may be used for providing the program to the computer.

(2) Substrate Processing

Figure 5:
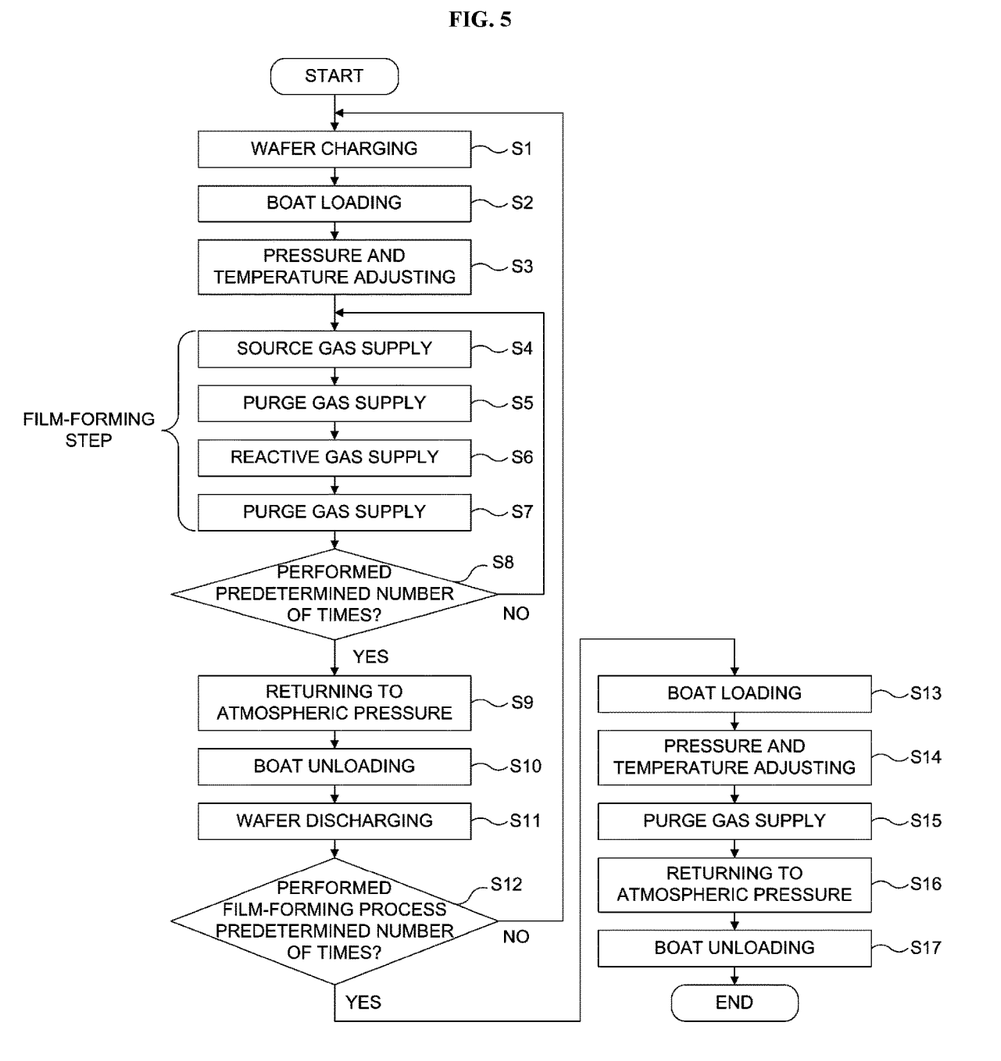
FIG. 5 is a flow chart schematically illustrating a substrate processing according to the embodiments described herein.
Figure 6:
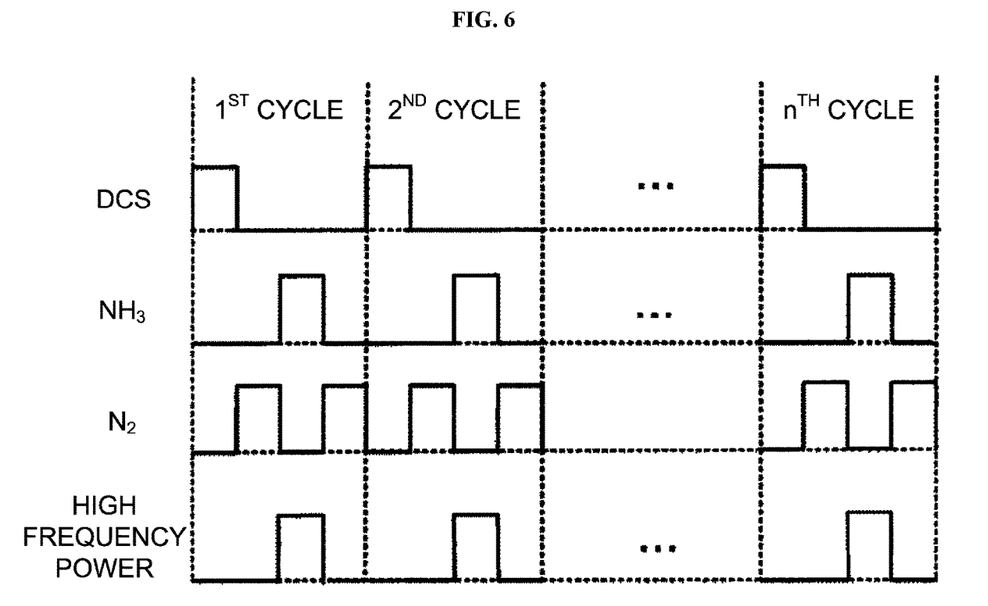
FIG. 6 is a timing diagram schematically illustrating a gas supply used in the substrate processing according to the embodiments described herein.

Hereinafter, the substrate processing (that is, the film-forming process) of forming a film on the wafer 200, which is a part of manufacturing processes of a semiconductor device, will be described with reference to FIGS. 5 and 6. Hereinafter, operations of the components constituting the substrate processing apparatus are controlled by the controller 121.

Hereinafter, an example of forming a silicon nitride film (SiN film) serving as a film containing silicon (Si) and nitrogen (N) on the wafer 200 will be described. The SiN film is formed on the wafer 200 by performing a cycle a predetermined number of times (once or more). The cycle includes a step of supplying the DCS gas serving as the source gas onto the wafer 200 and a step of supplying a plasma-excited ammonia (NH₃) gas serving as the reactive gas onto the wafer 200. The steps included in each cycle are performed non-simultaneously. A predetermined film may be formed on the wafer 200 in advance. Further, a predetermined pattern may be formed on the wafer 200 or on the predetermined film in advance.

In the present specification, a process flow of the film-forming process shown in FIG. 6 may be illustrated as follows.

(DCS→NH₃*)×n=>SiN

In the present specification, the term "wafer" may refer to "a wafer itself" or may refer to "a wafer and a stacked structure (aggregated structure) of a predetermined layer (or layers) or a film (or films) formed on a surface of the wafer". In the present specification, the term "a surface of a wafer" may refer to "a surface of a wafer itself" or may refer to "a surface of a predetermined layer or a film formed on a wafer". Thus, in the present specification, "forming a predetermined layer (or film) on a wafer" may refer to "forming a predetermined layer (or film) on a surface of a wafer itself" or may refer to "forming a predetermined layer (or film) on a surface of another layer or another film formed on a wafer". In the present specification, the term "substrate" and "wafer" may be used as substantially the same meaning. That is, the term "substrate" may be substituted by "wafer" and vice versa.

<Wafer Charging Step and Boat Loading Step: S1 and S2>

The plurality of the wafers including the wafer 200 are transferred into the boat 217 (wafer charging step S1). After the boat 217 is charged with the plurality of the wafers, the shutter 219s is moved by the shutter opener/closer 115s to open the lower end opening of the manifold 209 (shutter opening step). Then, as shown in FIG. 1, the boat 217 charged with the plurality of the wafers is elevated by the boat elevator 115 and transferred into the process chamber 201 (boat loading step S2). With the boat 217 loaded, the seal cap 219 seals the lower end opening of the manifold 209 via the O-ring 220b.

<Pressure and Temperature Adjusting Step: S3>

The vacuum pump 246 vacuum-exhausts the inner atmosphere of the process chamber 201 until the inner pressure of the process chamber 201 in which the plurality of the wafers including the wafer 200 are accommodated reaches and is maintained at a desired pressure (vacuum degree). In the pressure and temperature adjusting step S3, the inner pressure of the process chamber 201 is measured by the pressure sensor 245, and the APC valve 244 is feedback-controlled based on the measured pressure information (pressure adjusting step). The vacuum pump 246 continuously vacuum-exhausts the inner atmosphere of the process chamber 201 until at least a film-forming step described later is completed.

The heater 207 heats the process chamber 201 until the inner temperature of the process chamber 201 reaches and is maintained at a desired temperature. The state of the electric conduction to the heater 207 is feedback-controlled based on the temperature information detected by the temperature sensor 263 such that a desired temperature distribution of the inner temperature of the process chamber 201 can be obtained (temperature adjusting step). The heater continuously heats the process chamber 201 until at least the film-forming step described later is completed. However, when the film-forming step is performed at a temperature equal to or lower than the room temperature, the heating of the process chamber 201 by the heater 207 may be omitted. When the film-forming step is performed only at the temperature equal to or lower than the room temperature, the heater 207 may be omitted and the substrate processing apparatus may be implemented without the heater 207. In such a case, it is possible to simplify the configuration of the substrate processing apparatus.

Then, the rotator 267 rotates the plurality of the wafers including the wafer 200 by rotating the boat 217. The rotator 267 continuously rotates the boat 217 and the plurality of the wafers accommodated in the boat 217 until at least the film-forming step described later is completed.

<Film-Forming Step>

Thereafter, the film-forming step is performed by performing the cycle including a source gas supply step S4, a purge gas supply step S5, a reactive gas supply step S6 and a purge gas supply step S7.

<Source Gas Supply Step and Purge Gas Supply Step: S4 and S5>

In the step S4, the DCS gas is supplied onto the wafer 200 in the process chamber 201.

The valve 243a is opened to supply the DCS gas into the gas supply pipe 232a. After a flow rate of the DCS gas is adjusted by the MFC 241a, the DCS gas whose flow rate is adjusted is supplied into the process chamber 201 through the nozzle 249a and the gas supply holes 250a, and is exhausted through the exhaust pipe 231. Simultaneously, the valve 243c may be opened to supply the N₂ gas into the gas supply pipe 232c. After a flow rate of the N₂ gas is adjusted by the MFC 241c, the N₂ gas whose flow rate is adjusted is supplied with the DCS gas into the process chamber 201, and is exhausted through the exhaust pipe 231.

In order to prevent the DCS gas from entering the nozzle 249b, the valve 243d may be opened to supply the N₂ gas into the gas supply pipe 232d. The N₂ gas is supplied into the process chamber 201 through the gas supply pipe 232b and the nozzle 249b, and is exhausted through the exhaust pipe 231.

For example, a supply flow rate of the DCS gas adjusted by the MFC 241a may be within a range from 1 sccm to 6,000 sccm, preferably from 3,000 sccm to 5,000 sccm. In the present specification, a notation of a numerical range such as "from 1 sccm to 6,000 sccm" means that a lower limit and an upper limit are included in the numerical range. Therefore, for example, a numerical range "from 1 sccm to 6,000 sccm" means a range equal to or higher than 1 sccm and equal to or lower than 6,000 sccm. The same also applies to other numerical ranges described herein. For example, supply flow rates of the $N_2$ gas adjusted by the MFCs 241c and 241d may be within a range from 100 sccm to 10,000 sccm, respectively. For example, the inner pressure of the process chamber 201 may be within a range from 1 Pa to 2,666 Pa, preferably from 665 Pa to 1,333 Pa. For example, a time duration of exposing (supplying) the DCS gas onto the wafer 200 may be within a range from 1 second to 10 seconds, preferably from 1 second to 3 seconds. The time duration of exposing the wafer 200 to the DCS gas may vary depending on a thickness of the film.

The temperature of the heater 207 is set (adjusted) such that the temperature of the wafer 200 may be within a range from, for example, from 0° C. to 700° C., preferably from the room temperature (25° C.) to 550° C., and more preferably from 40° C. to 500° C. When the temperature of the wafer 200 is maintained at 700° C. or lower, preferably 550° C. or lower, and more preferably 500° C. or lower according to the present embodiment, it is possible to reduce the heat applied to the wafer 200. Thereby, it is possible to properly control the thermal history of the wafer 200.

By supplying the DCS gas into the process chamber 201 according to the above-described processing conditions, a silicon-containing layer is formed on the wafer 200 (that is, on a base layer formed on the surface of the wafer 200). The silicon-containing layer may contain chlorine (Cl) and hydrogen (H) in addition to silicon (Si). The silicon-containing layer may be formed by the physical adsorption of the DCS on a top surface of the wafer 200, by the chemical adsorption of substances generated by decomposing a part of the DCS on the top surface of the wafer 200, or by the deposition of silicon generated by the thermal decomposition of the DCS on the top surface of the wafer 200. That is, the silicon-containing layer may be an adsorption layer (a physical adsorption layer or a chemical adsorption layer) of the DCS or the substances generated by decomposing a part of the DCS, or may be a silicon deposition layer (a silicon layer).

After the silicon-containing layer is formed in the step S4, the valve 243a is closed to stop the supply of the DCS gas into the process chamber 201. With the APC valve 244 open, the vacuum pump 246 vacuum-exhausts the inner atmosphere of the process chamber 201 to remove a residual DCS gas or reaction byproducts which did not react or which contributed to the formation of the silicon-containing layer from the process chamber 201 (step S5). By maintaining the valves 243c and 243d open, the $N_2$ gas is continuously supplied into the process chamber 201. The $N_2$ gas serves as a purge gas. The step S5 is optional and may be omitted.

While the DCS gas is exemplified as the source gas in the present embodiment, various gases may be used as the source gas. Instead of the DCS gas, for example, an aminosilane source gas such as tetrakis(dimethylamino)silane ($Si[N(CH_3)_2]_4$, abbreviated as 4DMAS) gas, tris(dimethylamino)silane ($Si[N(CH_3)_2]_3H$, abbreviated as 3DMAS) gas, bis(dimethylamino)silane ($Si[N(CH_3)_2]_2H_2$, abbreviated as BDMAS) gas and bis(diethylamino)silane ($Si[N(C_2H_5)_2]_2H_2$, abbreviated as BDEAS) gas, bis(tertiarybutylamino) silane gas ($SiH_2[NH(C_4H_9)]_2$, abbreviated as BTBAS), dimethylaminosilane (DMAS) gas, diethylaminosilane (DEAS) gas, dipropylaminosilane (DPAS) gas, diisopropylaminosilane (DIPAS) gas, butylaminosilane (BAS) gas and hexamethyldisilazane (HMDS) gas may be used as the source gas. Instead of the DCS gas, for example, an inorganic halosilane source gas such as monochlorosilane ($SiH_3Cl$, abbreviated as MCS) gas, trichlorosilane ($SiHCl_3$, abbreviated as TCS) gas, tetrachlorosilane ($SiCl_4$, abbreviated as STC) gas, hexachlorodisilane ($Si_2Cl_6$, abbreviated as HCDS) gas and octachlorotrisilane ($Si_3Cl_8$, abbreviated as OCTS) gas may be used as the source gas. Instead of the DCS gas, for example, an inorganic silane source gas free of halogen such as monosilane ($SiH_4$, abbreviated as MS) gas, disilane ($Si_2H_6$, abbreviated as DS) gas and trisilane ($Si_3H_8$, abbreviated as TS) gas may also be used as the source gas.

While the $N_2$ gas is exemplified as the inert gas in the present embodiment, a rare gas such as argon (Ar) gas, helium (He) gas, neon (Ne) gas and xenon (Xe) gas may be used as the inert gas instead of the $N_2$ gas.

<Reactive Gas Supply Step and Purge Gas Supply Step: S6 and S7>

After the silicon-containing layer is formed, in the reactive gas supply step, the plasma-excited $NH_3$ gas serving as the reactive gas is supplied onto the wafer 200 in the process chamber 201 (step S6).

In the step S6, the opening and the closing of the valves 243b, 243c and 243d may be controlled in the same manners as those of the valves 243a, 243c and 243d in the step S4. After a flow rate of the $NH_3$ gas is adjusted by the MFC 241b, the $NH_3$ gas whose flow rate is adjusted is supplied into the buffer chamber 237 through the nozzle 249b. Simultaneously, the high frequency power is applied to the rod-shaped electrodes 269, 270 and 271. The $NH_3$ gas supplied into the buffer chamber 237 is excited into the plasma state (activated by the plasma), is supplied into the process chamber 201 as active species $NH_3^*$, and is exhausted through the exhaust pipe 231.

For example, a supply flow rate of the $NH_3$ gas adjusted by the MFC 241b may be within a range from 100 sccm to 10,000 sccm, preferably from 1,000 sccm to 2,000 sccm. For example, the high frequency power applied to the rod-shaped electrodes 269, 270 and 271 may be within a range from 50 W to 600 W. For example, the inner pressure of the process chamber 201 may be within a range from 1 Pa to 500 Pa. By using the plasma, the $NH_3$ gas is activated even when the inner pressure of the process chamber 201 is relatively low as described above. A time duration of exposing (supplying) the active species obtained by plasma-exciting the $NH_3$ gas onto the wafer 200 (that is, a gas supply time) may be within a range from 1 second to 180 seconds, preferably from 1 second to 60 seconds. Other processing conditions of the step S6 are the same as those of the step S4.

By supplying the $NH_3$ gas into the process chamber 201 according to the above-described processing conditions, the silicon-containing layer formed on the wafer 200 is plasma-nitrided. During the nitridation, Si—Cl bonds and Si—H bonds included in the silicon-containing layer are broken by the energy of the plasma-excited $NH_3$ gas. The chlorine (Cl) and hydrogen (H) separated from silicon (Si) are desorbed from the silicon-containing layer. The dangling bond of silicon in the silicon-containing layer produced due to the separation of chlorine and hydrogen enables the bonding of silicon in the silicon-containing layer to nitrogen (N) in the $NH_3$ gas to form Si—N bonds. As the reaction of forming the Si—N bonds progresses, the silicon-containing layer is changed (modified) into a layer containing silicon and nitrogen, that is, a silicon nitride layer (SiN layer).

In order to modify the silicon-containing layer into the SiN layer, it is preferable that the $NH_3$ gas is plasma-excited and then supplied. When the $NH_3$ gas is supplied under a non-plasma atmosphere, the energy demanded to nitride the silicon-containing layer may be insufficient at the above-described temperature range. Therefore, it is difficult to fully separate chlorine or hydrogen from the silicon-containing layer or fully nitride the silicon-containing layer to increase the number of the Si—N bonds.

After the silicon-containing layer is modified to the SiN layer, the valve 243b is closed to stop the supply of the NH$_3$ gas into the process chamber 201. The high frequency power applied to the rod-shaped electrodes 269, 270 and 271 is also stopped. The NH$_3$ gas and by-products remaining in the process chamber 201 are removed from the process chamber 201 according to the same sequence and conditions as those of the step S5 (step S7). The step S7 is optional and may be omitted.

While the NH$_3$ gas is exemplified as a nitriding agent in the present embodiment, instead of the NH$_3$ gas, a gas such as diazene (N$_2$H$_2$) gas, hydrazine (N$_2$H$_4$) gas and N$_3$H$_8$ gas may be used as the nitriding agent, that is, the nitrogen-containing gas excited by the plasma.

While the N$_2$ gas is exemplified as the inert gas in the present embodiment, a rare gas may be used instead of the N$_2$ gas as the inert gas similar to the step S4.

<Performing Predetermined Number of Times: S8>

By performing the cycle wherein the steps S4, S5, S6 and S7 are performed non-simultaneously in order a predetermined number of times (n times), a silicon nitride film (SiN film) of a predetermined composition and a predetermined thickness is formed on the wafer 200 (S8). It is preferable that the cycle is performed a plurality of times. That is, it is preferable that the SiN film of a desired thickness is formed by laminating the SiN layer thinner than the desired thickness by performing the cycle a plurality of times until the desired thickness obtained.

<Returning to Atmospheric Pressure Step: S9>

After the film-forming step described above is completed, the N$_2$ gas serving as the inert gas is supplied into the process chamber 201 through each of the gas supply pipes 232c and 232d, and then is exhausted through the exhaust pipe 231. The process chamber 201 is thereby purged with the inert gas such that the gas or the reaction by-products remaining in the process chamber 201 are removed from the process chamber 201 (purging by inert gas). Thereafter, the inner atmosphere of the process chamber 201 is replaced with the inert gas (substitution by inert gas), and the inner pressure of the process chamber 201 is returned to the atmospheric pressure (S9).

<Boat Unloading Step and Wafer Discharging Step: S10 and S11>

Then, the seal cap 219 is lowered by the boat elevator 115 and the lower end of the manifold 209 is opened. The boat 217 with a plurality of processed wafers including the wafer 200 charged therein is unloaded out of the reaction tube 203 through the lower end of the manifold 209 (boat unloading step S10). After the boat 217 is unloaded, the shutter 219s is moved. Thereby, the lower end of the manifold 209 is sealed by the shutter 219s through the O-ring 220c (shutter closing step). The plurality of the processed wafers including the wafer 200 are taken out of the reaction tube 203, and then discharged from the boat 217 (wafer discharging step S11).

<Performing Film-forming Process Predetermined Number of Times: S12>

In a step S12, it is determined whether or not the film-forming process (that is, the steps S1 through S11) has been performed a predetermined number of times. When the film-forming process has not been performed the predetermined number of times, the steps S1 through S11 are repeatedly performed. When the film-forming process has been performed the predetermined number of times, a purge gas supply step (inert gas supply step) S15 of purging the inner wall of the reaction tube 203 is performed as described later. For example, the predetermined number of times may be set to 20 times. That is, when the film-forming process is performed 20 times (that is, 20 batches), the purge gas supply step S15 of purging the inner wall of the reaction tube 203 is performed. The predetermined number of times of the film-forming process may be appropriately determined by a thickness of the by-products deposited on the inner wall of the reaction tube 203.

<Boat Loading Step: S13>

The shutter 219s is moved by the shutter opener/closer 115s to open the lower end opening of the manifold 209 (shutter opening step). Then, the boat 217 without accommodating the plurality of the wafers (also referred to as "empty boat 217") is elevated by the boat elevator 115 and transferred into the process chamber 201 (boat loading step S13). With the empty boat 217 loaded, the seal cap 219 seals the lower end opening of the manifold 209 via the O-ring 220b.

<Pressure and Temperature Adjusting Step: S14>

The vacuum pump 246 vacuum-exhausts the inner atmosphere of the process chamber 201 until the inner pressure of the process chamber 201 reaches and is maintained at a desired pressure (vacuum degree). In the pressure and temperature adjusting step S14, the inner pressure of the process chamber 201 is measured by the pressure sensor 245, and the APC valve 244 is feedback-controlled based on the measured pressure information (pressure adjusting step). The vacuum pump 246 continuously vacuum-exhausts the inner atmosphere of the process chamber 201 until at least the purge gas supply step S15 of purging the inner wall of the reaction tube 203, which is described later, is completed.

The heater 207 heats the process chamber 201 until the inner temperature of the process chamber 201 reaches and is maintained at a desired temperature. The state of the electric conduction to the heater 207 is feedback-controlled based on the temperature information detected by the temperature sensor 263 such that a desired temperature distribution of the inner temperature of the process chamber 201 can be obtained (temperature adjusting step). The heater continuously heats the process chamber 201 until at least the purge gas supply step S15 of purging the inner wall of the reaction tube 203, which is described later, is completed. However, when the purge gas supply step S15 of purging the inner wall of the reaction tube 203 is performed at a temperature equal to or lower than the room temperature, the heating of the process chamber 201 by the heater 207 may be omitted.

Then, the rotator 267 rotates the empty boat 217. The rotator 267 continuously rotates the empty boat 217 until at least the purge gas supply step S15 of purging the inner wall of the reaction tube 203, which is described later, is completed.

<Purge Gas Supply Step: S15>

When the rotator 267 rotates the empty boat 217 at a predetermined speed, the N$_2$ gas serving as the purge gas (inert gas) is supplied to the hollow portion 35 of the empty boat 217 at a desired supply flow rate, and the N$_2$ gas is ejected at a predetermined flow rate toward the inner wall of the reaction tube 203 through the gas supply ports 36 provided at the support column 32a of the empty boat 217. Further, the N$_2$ gas is ejected at a predetermined flow rate toward the manifold (inlet flange) 209 and/or the inlet adapter 209a provided under the reaction tube 203 through the gas supply port 37 of the rotating shaft 255.

For example, a process time of purging the inner wall of the reaction tube 203 in the step S15 may be set to about 5 minutes when the rotation speed of the empty boat 217 is one rotation per minute. Further, the process time of purging the inner wall of the reaction tube 203 in the step S15 may be appropriately determined based on parameters such as the thickness of the by-products of the inner wall of the reaction tube 203 and the supply flow rate of the purge gas.

While the present embodiment is described by way of an example in which the purge gas supply step S15 of purging the inner wall of the reaction tube 203 is performed after the film-forming process is performed the predetermined number of times, the present embodiment is not limited thereto. For example, the purge gas supply step S15 of purging the inner wall of the reaction tube 203 may be performed simultaneously with the step S5 or S7 of supplying the purge gas in the film-forming process. Further, the purge gas supply step S15 of purging the inner wall of the reaction tube 203 may be performed simultaneously with a cleaning process of cleaning the inside of the reaction tube 203.

<Returning to Atmospheric Pressure Step: S16>

After the purge gas supply step S15 of purging the inner wall of the reaction tube 203 is completed, the inner pressure of the process chamber 201 is returned to the atmospheric pressure (S16).

<Boat Unloading Step: S17>

Then, the seal cap 219 is lowered by the boat elevator 115 and the lower end of the manifold 209 is opened. The empty boat 217 is unloaded out of the reaction tube 203 through the lower end of the manifold 209 (boat unloading step S17).

As described above, the present embodiment is described by way of an example in which the substrate processing apparatus 100 is provided with the buffer structure 300. However, the buffer structure 300 is optional and may be omitted. For example, the present embodiment may also be applied to a substrate processing apparatus without the buffer structure 300.

(3) Effects according to Present Embodiment (a) The hollow portion 35 and the gas supply ports 36, through which the purge gas is supplied toward the inner wall of the reaction tube 203, are provided at at least one (for example, at the support column 32a) among the three support columns 32a, 32b, 32c. Thereby, it possible to supply the purge gas to the regions 203a and 203b on the inner wall of the reaction tube 203 where the foreign substance (the by-products) is likely to adhere or remain. Further, it is also possible to effectively remove the foreign substance adhered to or remaining in the regions 203a and 203b on the inner wall of the reaction tube 203.

(b) The gas supply port 37 configured to supply the purge gas to the manifold (inlet flange) 209 and/or the inlet adapter 209a provided under the reaction tube 203 is provided at the rotating shaft 255. Thereby, it possible to remove the by-products deposited below the reaction tube 203.

Other Embodiments

For example, the above-described embodiment is described by way of an example in which the reactive gas is supplied after the source gas is supplied. However, the above-described technique is not limited thereto. The above-described technique may also be applied when a supply order of the source gas and the reactive gas is changed. That is, the above-described technique may be applied when the source gas is supplied after the reactive gas is supplied. By changing the supply order of the gases, it is possible to change the quality or the composition of the film formed by performing the substrate processing.

For example, the above-described embodiment is described by way of an example in which the silicon nitride film (SiN film) on the wafer 200. However, the above-described technique is not limited thereto. For example, the above-described technique may also be applied to form, on the wafer 200, a silicon-based oxide film such as a silicon oxide film (SiO film), a silicon oxycarbide film (SiOC film), a silicon oxycarbonitride film (SiOCN film) and a silicon oxynitride film (SiON film). For example, the above-described technique may also be applied to form, on the wafer 200, a silicon-based nitride film such as a silicon carbonitride film (SiCN film), a silicon boronitride film (SiBN film) and a silicon boron carbonitride film (SiBCN film). In such cases, an oxygen (O)-containing gas, a carbon (C)-containing gas such as $C_3H_6$, a nitrogen (N)-containing gas such as $NH_3$ and a boron (B)-containing gas such as $BCl_3$ may be used as the reactive gas to form the above-described films.

The above-described technique may also be applied to form, on the wafer 200, an oxide film (which is a metal-based oxide film) or a nitride film (which is a metal-based nitride film) containing a metal element such as titanium (Ti), zirconium (Zr), hafnium (Hf), tantalum (Ta), niobium (Nb), aluminum (Al), molybdenum (Mo) and tungsten (W). That is, the above-described technique may also be applied to form, on the wafer 200, a film such as a TiO film, a TiN film, a TiOC film, a TiOCN film, a TiON film, a TiBN film, a TiBCN film, a ZrO film, a ZrN film, a ZrOC film, a ZrOCN film, a ZrON film, a ZrBN film, a ZrBCN film, a HfO film, and a HfN film, a HfOC film, a HfOCN film, a HfON film, a HfBN film, a HfBCN film, a TaO film, a TaOC film, a TaOCN film, a TaON film, a TaBN film, a TaBCN film, a NbO film, a NbN film, a NbOC film, a NbOCN film, a NbON film, a NbBN film, a NbBCN film, an AlO film, an AlN film, an AlOC film, an AlOCN film, an AlON film, an AlBN film, an AlBCN film, a MoO film, a MoN film, a MoOC film, a MoOCN film, a MoON film, a MoBN film, a MoBCN film, a WO film, a WN film, a WOC film, a WOCN film, a WON film, a WBN film and a WBCN film.

For example, various gases such as tetrakis(dimethylamino)titanium ($Ti[N(CH_3)_2]_4$, abbreviated as TDMAT) gas, tetrakis(ethylmethylamino)hafnium ($Hf[N(C_2H_5)(CH_3)]_4$, abbreviated as TEMAH) gas, tetrakis(ethylmethylamino) zirconium ($Zr[N(C_2H_5)(CH_3)]_4$, abbreviated as TEMAZ) gas, trimethylaluminum ($Al(CH_3)_3$, abbreviated as TMA) gas, titanium tetrachloride ($TiCl_4$) gas and hafnium tetrachloride ($HfCl_4$) gas may be used as the source gas to form the metal-based oxide film or the metal-based nitride film described above. As the reactive gas, the above-described reactive gas may be used.

That is, the above-described technique may also be applied to form a metalloid film containing a metalloid element or a metal-based film containing a metal element. The processing sequences and the processing conditions of the film-forming process of the metalloid film or the metal-based film may be substantially the same as those of the film-forming process according to the embodiment or the modified examples. Even when the above-described technique is applied to the film-forming process of the metalloid film or the metal-based film, it is possible to obtain the same effects as the above-described embodiment or the modified examples.

Recipes used in the film-forming process are preferably prepared individually according to the process contents and stored in the memory 121c via an electric communication line or the external memory 123. When starting various processes, the CPU 121a is configured to select an appropriate recipe among the recipes stored in the memory 121c according to the process contents. Thus, various films of different composition ratios, qualities and thicknesses may be formed in a reproducible manner by using a single substrate processing apparatus. In addition, since the burden on an operator of the substrate processing apparatus may be reduced, various processes may be performed quickly while avoiding a malfunction of the substrate processing apparatus.

The above-described recipe is not limited to creating a new recipe. For example, the recipe may be prepared by changing an existing recipe stored in the substrate processing apparatus in advance. When changing the existing recipe to a new recipe, the new recipe may be installed in the substrate processing apparatus via the electric communication line or the recording medium in which the new recipe is stored. The existing recipe already stored in the substrate processing apparatus may be directly changed to a new recipe by operating the input/output device 122 of the substrate processing apparatus.

While the technique is described in detail by way of the embodiment and the modified examples, the above-described technique is not limited thereto. The above-described technique may be modified in various ways without departing from the gist thereof.

As described above, according to some embodiments in the present disclosure, it is possible to efficiently remove the foreign substance in the reaction tube of the substrate processing apparatus.

What is claimed is:

1. A substrate processing apparatus comprising:
   a reaction tube in which a substrate is processed; and
   a substrate retainer comprising a plurality of support columns configured to support the substrate, wherein at least one among the plurality of the support columns comprises:
       a hollow portion through which an inert gas is supplied; and
       a gas supply port through which the inert gas is supplied toward an inner wall of the reaction tube.

2. The substrate processing apparatus of claim 1, further comprising:
   a rotator configured to rotate the substrate retainer.

3. The substrate processing apparatus of claim 2, wherein the rotator comprises:
   a rotating shaft configured to rotate the substrate retainer;
   a rotating table configured to support the substrate retainer; and
   a first gas supply pipe and a second gas supply pipe configured to supply the inert gas to the hollow portion, the first gas supply pipe being provided at the rotating shaft, and the second gas supply pipe being provided at the rotating table.

4. The substrate processing apparatus of claim 3, wherein the first gas supply pipe is provided at a center of the rotating shaft.

5. The substrate processing apparatus of claim 1, wherein a plurality of gas supply ports comprising the gas supply port are provided at the at least one among the plurality of the support columns from a lower portion to an upper portion of the reaction tube, each of which is open toward the inner wall of the reaction tube.

6. The substrate processing apparatus of claim 1, further comprising:
   a process gas supplier configured to supply a process gas into the reaction tube; and
   an exhauster configured to exhaust an inner atmosphere of the reaction tube.

7. A substrate retainer comprising
   a plurality of support columns configured to support a substrate,
   wherein at least one among the plurality of the support columns comprises:
       a hollow portion through which an inert gas is supplied; and
       a gas supply port through which the inert gas is supplied toward an inner wall of a reaction tube.

8. The substrate retainer of claim 7, further comprising a rotator configured to rotate the substrate.

9. The substrate retainer of claim 8, wherein the rotator comprises:
   a rotating shaft configured to rotate the substrate;
   a rotating table configured to support the plurality of the support columns; and
   a first gas supply pipe and a second gas supply pipe configured to supply the inert gas to the hollow portion, the first gas supply pipe being provided at the rotating shaft, and the second gas supply pipe being provided at the rotating table.

10. The substrate retainer of claim 9, wherein the first gas supply pipe is provided at a center of the rotating shaft.

11. The substrate retainer of claim 7, wherein a plurality of gas supply ports comprising the gas supply port are provided at the at least one among the plurality of the support columns from a lower portion to an upper portion of the reaction tube, each of which is open toward the inner wall of the reaction tube.

12. A method of manufacturing a semiconductor device, comprising:
   (a) loading a substrate retainer in which a substrate is supported into a reaction tube;
   (b) supplying a process gas into the reaction tube;
   (c) unloading the substrate retainer out of the reaction tube; and
   (d) supplying an inert gas toward an inner wall of the reaction tube through a support column of the substrate retainer.

* * * * *